(12) United States Patent
Fan et al.

(10) Patent No.: US 9,742,411 B1
(45) Date of Patent: Aug. 22, 2017

(54) SIMULTANEOUS ECONOMIC DISPATCH AND FREQUENCY REGULATION OF POWER SYSTEMS

(71) Applicants: Lingling Fan, Tampa, FL (US); Zhixin Miao, Tampa, FL (US)

(72) Inventors: Lingling Fan, Tampa, FL (US); Zhixin Miao, Tampa, FL (US)

(73) Assignee: UNIVERSITY OF SOUTH FLORIDA, Tampa, FL (US)

( * ) Notice: Subject to any disclaimer, the term of this patent is extended or adjusted under 35 U.S.C. 154(b) by 0 days.

(21) Appl. No.: 14/873,501

(22) Filed: Oct. 2, 2015

Related U.S. Application Data

(60) Provisional application No. 62/208,961, filed on Aug. 24, 2015.

(51) Int. Cl.
| | |
|---|---|
| G05D 3/12 | (2006.01) |
| G05D 5/00 | (2006.01) |
| G05D 9/00 | (2006.01) |
| G05D 11/00 | (2006.01) |
| H03L 5/02 | (2006.01) |
| G05B 11/01 | (2006.01) |

(52) U.S. Cl.
CPC ............... *H03L 5/02* (2013.01); *G05B 11/01* (2013.01)

(58) Field of Classification Search
CPC .................................. H03L 5/02; G05B 11/01
USPC .................................................. 700/286–297
See application file for complete search history.

(56) References Cited

U.S. PATENT DOCUMENTS

| | | | |
|---|---|---|---|
| 6,338,009 B1 | 1/2002 | Sato et al. | |
| 2003/0112732 A1* | 6/2003 | Masui | G11B 7/0062 369/59.12 |

(Continued)

FOREIGN PATENT DOCUMENTS

| | | |
|---|---|---|
| CA | 2809896 | 3/2013 |
| CN | 103457297 | 12/2013 |

OTHER PUBLICATIONS

A. J. Wood and B. F. Wollenberg, Power generation, operation, and control. 2nd edition John Wiley & Sons, 1996, pp. 54-57 and 356-357.
Li, Na, Lijun Chen, Changhong Zhao, and Steven H. Low. "Connecting automatic generation control and economic dispatch from an optimization view," American Control Conference (ACC), Jun. 2014, pp. 735-740.
F. Dorfler, J. Simpson-Porco, and F. Bullo, "Breaking the hierarchy: Distributed control & economic optimality in microgrids," arXiv preprint arXiv:1401.1767, Dec. 2014.

(Continued)

*Primary Examiner* — Ziaul Karim
(74) *Attorney, Agent, or Firm* — Thomas|Horstemeyer, LLP.

(57) ABSTRACT

Various examples are provided for feedback control of power systems. The feedback control can provide simultaneous frequency regulation and economic operation of a power system. In one example, a method includes obtaining a frequency difference associated with a generator of a power system; determining an output power adjustment based at least in part upon the frequency difference and a cost function associated with the generator; and providing a power command to a secondary frequency control of the generator, the power command based upon the output power adjustment. In another example, a generator control system includes a primary frequency controller configured to control frequency droop of a generator of a power system; and a secondary frequency controller configured to adjust output power of the generator based at least in part upon a frequency difference associated with the generator and a cost function associated with the generator.

16 Claims, 10 Drawing Sheets

(56) References Cited

U.S. PATENT DOCUMENTS

| | | | | |
|---|---|---|---|---|
| 2004/0051387 A1* | 3/2004 | Lasseter | ............... | H02J 3/46 |
| | | | | 307/80 |
| 2004/0249775 A1* | 12/2004 | Chen | ............... | G06Q 50/06 |
| | | | | 706/21 |
| 2005/0077881 A1* | 4/2005 | Capp | ............... | H02J 3/30 |
| | | | | 322/29 |
| 2007/0114796 A1* | 5/2007 | Garces | ............... | F03D 9/008 |
| | | | | 290/43 |
| 2011/0245987 A1* | 10/2011 | Pratt | ............... | H01M 10/44 |
| | | | | 700/295 |
| 2013/0002032 A1* | 1/2013 | Mori | ............... | H02J 3/34 |
| | | | | 307/84 |
| 2013/0321040 A1 | 12/2013 | Johal et al. | | |
| 2014/0222239 A1 | 8/2014 | Watanabe et al. | | |
| 2015/0057821 A1* | 2/2015 | Nasle | ............... | G06Q 10/04 |
| | | | | 700/291 |

OTHER PUBLICATIONS

V. R. Disfani, L. Fan, L. Piyasinghe, and Z. Miao, "Multi-agent control of community and utility using lagrangian relaxation based dual decomposition," Electric Power Systems Research, vol. 110, pp. 45-54, May 2014.

V. R. Disfani, L. Fan, and Z. Miao, "Distributed dc optimal power flow for radial networks through partial primal dual algorithm," in PES General Meeting—Conference & Exposition, IEEE, Jul. 2015, pp. 1-5.

V. R. Disfani, Z. Miao, L. Fan, and B. Zeng, "Dual decomposition based privacy-preserving multi-horizon utility-community decision making paradigms," http://arxiv.org/abs/1503.09087, Mar. 2015.

\* cited by examiner

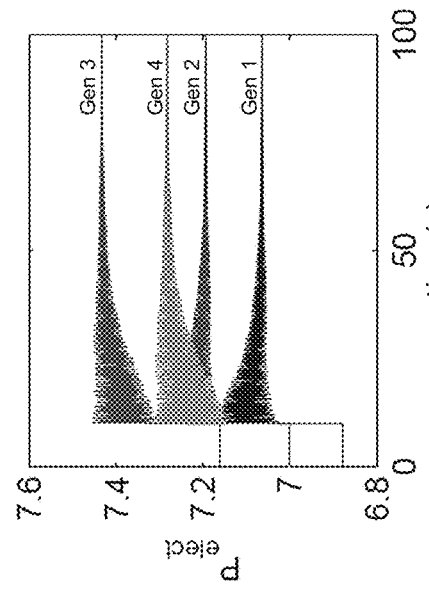
FIG. 9A
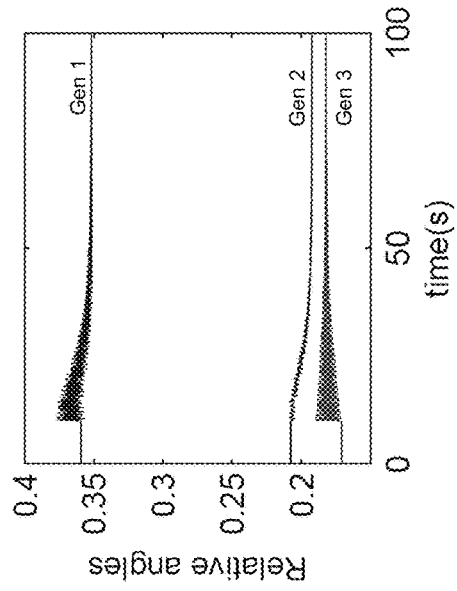
FIG. 9B
FIG. 9C
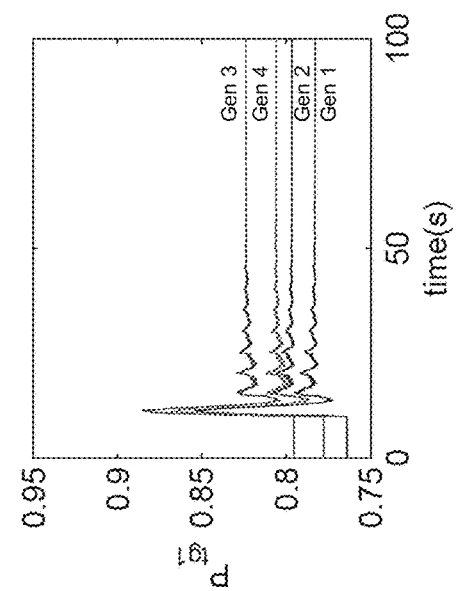
FIG. 9D

COMPARISON OF THREE CASES ON GENERATOR OUTPUT ELECTRIC POWER $P_e$ (MW).

|  | Initial | Case 0 | | Case 1 | | Case 2 | |
| --- | --- | --- | --- | --- | --- | --- | --- |
|  | $P_{e0}$ | $P_e$ | $\Delta P_e$ | $P_e$ | $\Delta P_e$ | $P_e$ | $\Delta P_e$ |
| Gen 1 | 687.76 | 708.85 | 21.09 | 705.06 | 18.55 | 706.35 | 18.59 |
| Gen 2 | 700 | 720.45 | 20.45 | 716.68 | 19.32 | 719.27 | 19.27 |
| Gen 3 | 716 | 737.14 | 21.14 | 742.21 | 27.24 | 743.26 | 27.26 |
| Gen 4 | 700 | 720.50 | 20.50 | 725.65 | 28.17 | 728.17 | 28.17 |

FIG. 10A

COMPARISON OF THREE CASES ON GENERATOR OUTPUT ELECTRIC POWER $P_m$ (MW).

|  | Initial | Case 0 | | Case 1 | | Case 2 | |
| --- | --- | --- | --- | --- | --- | --- | --- |
|  | $P_{m0}$ | $P_m$ | $\Delta P_m$ | $P_m$ | $\Delta P_m$ | $P_m$ | $\Delta P_m$ |
| Gen 1 | 687.76 | 708.65 | 20.89 | 705.70 | 17.94 | 705.74 | 17.98 |
| Gen 2 | 700 | 720.89 | 20.89 | 717.97 | 17.97 | 717.91 | 17.91 |
| Gen 3 | 716 | 736.89 | 20.89 | 742.80 | 26.79 | 742.80 | 26.80 |
| Gen 4 | 700 | 720.89 | 20.89 | 726.86 | 26.86 | 726.86 | 26.80 |

FIG. 10B

SIMULTANEOUS ECONOMIC DISPATCH AND FREQUENCY REGULATION OF POWER SYSTEMS

CROSS REFERENCE TO RELATED APPLICATIONS

This application claims priority to, and the benefit of, U.S. provisional application entitled "SIMULTANEOUS ECONOMIC DISPATCH AND FREQUENCY REGULATION OF POWER SYSTEMS" having Ser. No. 62/208,961, filed Aug. 24, 2015, which is hereby incorporated by reference in its entirety.

BACKGROUND

Distributed optimization applications in power systems have been examined in the literature. Applications include economic dispatch, AC optimal power flow (AC-OPF), DC optimal power flow, voltage control, multi-horizon optimization such as electric vehicle operation and battery operation. The applications have focused on power system models that are represented by algebraic equations, where the power balance is an equality constraint that is monitored.

BRIEF DESCRIPTION OF THE DRAWINGS

Many aspects of the present disclosure can be better understood with reference to the following drawings. The components in the drawings are not necessarily to scale, emphasis instead being placed upon clearly illustrating the principles of the present disclosure. Moreover, in the drawings, like reference numerals designate corresponding parts throughout the several views.

FIGS. 9A through 9D are plots illustrating the dynamics of the power system of FIG. 3 with the discrete secondary frequency control of FIG. 8 in accordance with various embodiments of the present disclosure.

FIGS. 10A and 10B are tables comparing the operations of the power system of FIG. 3 with and without the secondary frequency control of FIG. 4 in accordance with various embodiments of the present disclosure.

DETAILED DESCRIPTION

Figure 1A:
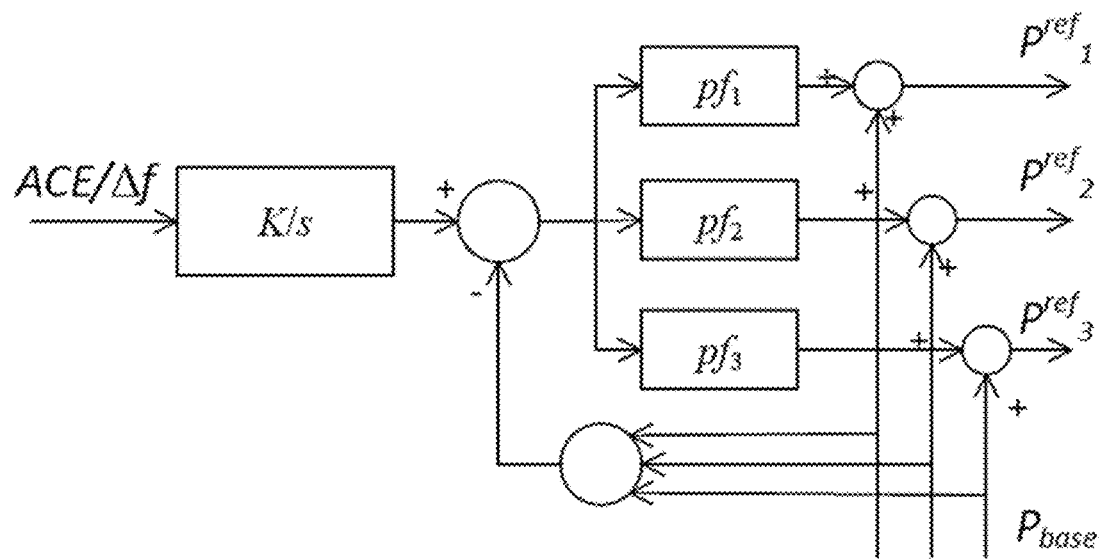
FIGS. 1A and 1B are schematic diagrams illustrating examples of automatic generation controls (AGCs) in accordance with various embodiments of the present disclosure.

Disclosed herein are various embodiments of methods and systems related to feedback control of power systems. The feedback control can provide simultaneous frequency regulation and economic operation of a power system. Reference will now be made in detail to the description of the embodiments as illustrated in the drawings, wherein like reference numbers indicate like parts throughout the several views.

Figure 1B:
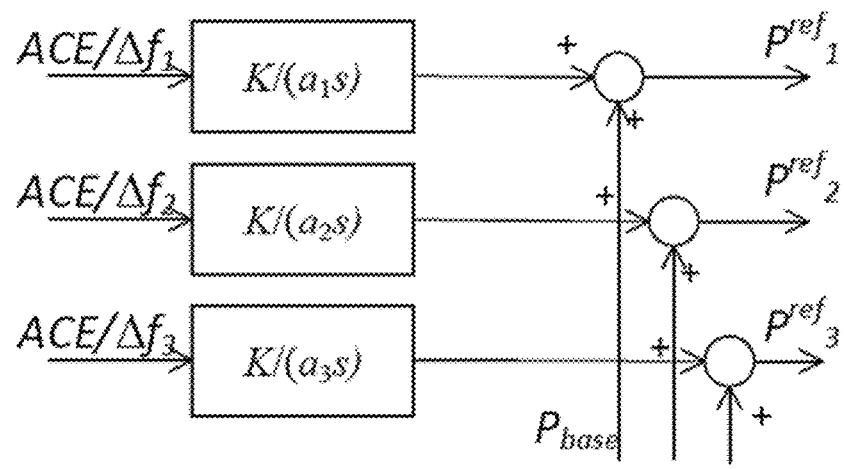

Droop control may be viewed as a primal-dual optimization problem solving procedure. Referring to FIG. 1A, shown is an example of an automatic generation control (AGC). AGC can be connected with partial primal-dual iterative optimization procedures using forward engineering and reverse engineering. The modified AGC can be a more complicated controller utilizing information from neighboring generators. This disclosure offers a much simpler and straightforward connection between AGC and economic dispatch. FIG. 1B shows an example of the disclosed AGC.

A unique feature of power systems is that frequency deviation can reflect the power imbalance of the power system. Further, their relationship at steady-state can be linear should the primary frequency droop control be in place. Frequency measurements can be obtained locally at the buses and/or generators. This feature greatly facilitates the implementation of distributed decision making in power systems. Validation of a distributed decision making architecture using frequency deviation can be conducted in a dynamic simulation platform, since algebraic based models cannot reflect frequency dynamics.

When the frequency deviation is used to reflect power imbalance, a dual ascent and the method of multipliers-based update can be realized through local feedback control. This indicates that economic operation can be realized through local feedback based secondary frequency control. This finding concurs with standard AGC implementation practice where the participation factor approach is adopted. In the participation factor approach, each generator will be allocated a portion (notated as the participation factor) of the total power change. This participation factor is proportional to the quadratic cost coefficient of the generator.

The parameters of secondary frequency control based on integral or proportional integral control can be tuned to achieve economic operation and frequency regulation simultaneously. If the power imbalance is represented by frequency deviation, an iterative dual decomposition based economic dispatch solving is equivalent to integral control and an iterative method of multipliers based economic dispatch is equivalent to proportional integral control. Similarly, if the controller parameters of the secondary frequency controls are chosen based on generator cost functions, these secondary frequency controllers achieve both economic operation and frequency regulation simultaneously.

Validation of a distributed decision making architecture using frequency deviation was conducted in a dynamic simulation platform. A two-area system is used to explain the finding. The dual decomposition based iterative economic dispatch problem is presented, and the corresponding continuous dynamic model derived. The method of multipliers based iterative approach is also presented, and the continuous dynamic model again derived. When the power imbalance can be represented by frequency deviation, the dual decomposition approach is similar to an integral control and the method of multipliers approach is similar to a proportional integral control. The parameters of the feedback control for each generator (e.g., input: frequency deviation, output: turbine-governor's power reference) can be selected according to generator cost functions. This selection can lead to simultaneous frequency regulation and economic operation. Centralized economic dispatch can be carried out less frequently since AGC control can take care of economic operation.

Dual Decomposition Based Iterative Economic Dispatch

For a two-area system, each area with a generator (dispatch level $P_i$) and a load ($D_i$), the economic dispatch problem can be expressed as follows:

$$\min_{P_1, P_2} C_1(P_1) + C_2(P_2) \tag{1}$$

$$\text{subject to}: P_1 + P_2 = D_1 + D_2.$$

where $C_i(P_i) = a_i P_i^2 + b_i P_i + c_i$ is the cost function. The dual problem is as follows:

$$\max_{\lambda} \min_{P_1} C_1(P_1) + \lambda(D_1 - P_1) \tag{2}$$
$$+ \min_{P_2} C_2(P_2) + \lambda(D_2 - P_2).$$

For a given $\lambda$, Area 1 and Area 2 can carry out minimization problems separately. The price $\lambda$ is then updated to maximize the objective function of the dual problem. In addition, assume that the system has primary frequency control in place. Therefore, at steady-state, the power imbalance will be represented by the frequency deviation with a gain ($\Sigma D_i - \Sigma P_i = -\beta \Delta f$, where $\beta = \Sigma 1/R_i$ if the damping of the generators are ignored and $R_i$ is the droop parameter of generator i). In addition, the power imbalance will be represented by the frequency deviation with a gain. The iterative procedure of $\lambda$ update is as follows:

$$\lambda^{k+1} = \lambda^k + \alpha(D_1 + D_2 - P_1 - P_2) \tag{3}$$

$$= \lambda^k - K \Delta f^k. \tag{4}$$

where $\alpha$ and $K = \alpha\beta$ are positive constants and $\alpha$ can be chosen to be small enough to ensure the convergence of the iteration. Therefore, the value of K will not be overly large.

Ignoring the generator limits, the marginal costs of the generators should equal the price at each step, such that:

$$\lambda^k = 2a_1 P_1^k + b_1 = 2a_2 P_2^k + b_2. \tag{5}$$

Therefore, the iteration for the power commands that will be sent to the turbine governors are:

$$P_1^{k+1} = P_1^k - \frac{K}{2a_1} \Delta f_1^k, \tag{6}$$

$$P_2^{k+1} = P_2^k - \frac{K}{2a_2} \Delta f_2^k, \tag{7}$$

The above equations lead to further examination on convergence. Note that equation (6) can also be expressed as:

$$P_1^{k+1} = P_1^k + \frac{\alpha}{2a_1}(D_1 + D_2 - P_1^k - P_2^k) \tag{8}$$
$$= \left(1 - \frac{\alpha}{2a_1}\right) P_1^k + + \frac{\alpha}{2a_1}(D_1 + D_2 - P_2^k).$$

To ensure the convergence for the above iterative process, $$\left|1 - \frac{\alpha}{2a_1}\right| < 1. \tag{9}$$

Assuming that $a_1=1$, $\alpha<4$, and if $\beta=20$, then K<80.

The continuous dynamic model of the above procedure can be obtained using Forward Euler approximation for derivatives as follows:

$$\tau \dot{P}_1 = -\frac{K}{2a_1} \Delta f_1, \tag{10}$$

$$\tau \dot{P}_2 = -\frac{K}{2a_2} \Delta f_2. \tag{11}$$

where $\tau$ is the step size of the discrete iteration.

The continuous dynamic model not only indicates that dual decomposition (or accent) based economic dispatch is equivalent to an integrator in the secondary frequency control, but also indicates that if the gains of the integral controllers for generators are chosen based on generators' cost functions, the local feedback control can realize economic dispatch and frequency regulation simultaneously.

Three assumptions can be utilized for the disclosed control.

First, the generator cost functions can be assumed to be convex and quadratic. The majority of generators have quadratic cost functions. Piecewise linear cost functions can be used to facilitate linear programming based operation. In cases where piecewise linear cost functions are used to represent cost functions, quadratic cost functions can be sought to match the piecewise linear cost functions for those generators. When there are linear or constant cost functions, these generators will not be equipped with secondary frequency controllers. Instead, a hybrid discrete decision making procedure along with the feedback controllers can be used. At each iteration, the price (or Lagrangian multiplier $\lambda^k$) can be updated based on the frequency deviation and can be compared with the generator's marginal price. For example, decisions can be made as follows.

$$P_i^k = \begin{cases} p_i^{max}, & \text{if } \lambda^k \geq b_i \text{ and } a_i = 0; \\ p_i^{min}, & \text{if } \lambda^k < b_i \text{ and } a_i = 0. \end{cases} \tag{12}$$

Second, the primary frequency control can be assumed to be in place.

Figure 2A:
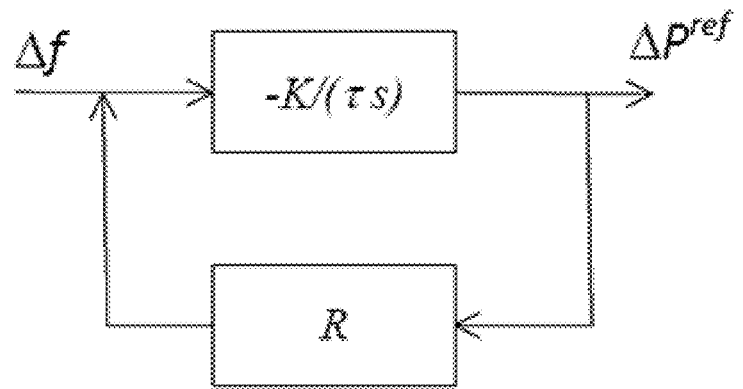
FIGS. 2A and 2B are schematic diagrams illustrating examples of primary and secondary frequency controls in accordance with various embodiments of the present disclosure.

Third, the local frequency measurements can be assumed to be quasi steady-state. The secondary frequency control has a slower response or bandwidth compared to the rest of the system dynamics. Therefore, the primary frequency response can be considered to be fast enough to achieve steady-state from the point view of the secondary frequency control. For example, bandwidths are discussed to show that this assumption is reasonable. Consider a generator with all units in per unit. Ignore the primary frequency response dynamics and assume that the droop parameter is 5%. Referring to FIG. 2A, shown is a system block diagram illustrating an example of a simplified secondary frequency control of this generator. The closed-loop system transfer function is given by $$-1 \Big/ \Big( \frac{\tau}{KR} s + 1 \Big).$$

Figure 2B:
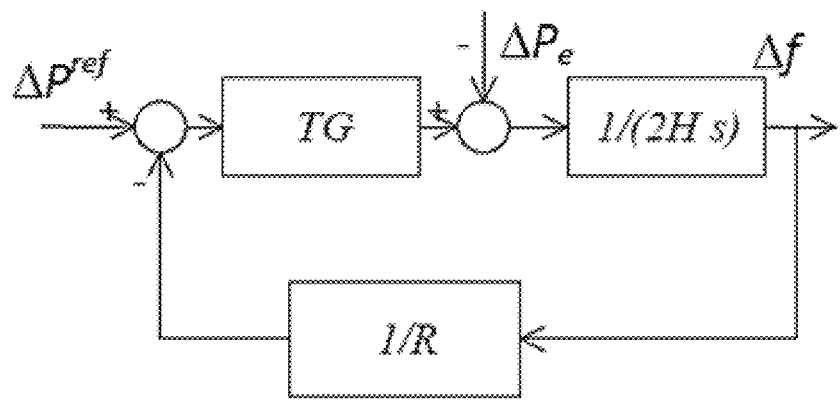

Therefore, for $\tau=5$ seconds, $K=50$ and $R=5\%$, the bandwidth is 0.5 rad/s. If the integral controller gain is reduced to 5 ($K=5$), then the bandwidth of the secondary frequency control is 0.05 rad/s. If the primary frequency response dynamics are considered, the aforementioned bandwidths will be even lower. The primary frequency response bandwidth is usually much higher. A system block diagram illustrating an example of a simplified primary frequency control is shown in FIG. 2B. With the inertia constant $H=5$ s·pu, $R=5\%$, and the dynamics of the turbine-governor ignored, the closed loop transfer function is $1/(2H\,Rs+1)$, with a bandwidth of 2 rad/s.

To this end, the resulting simplified controller of FIG. 1B can achieve the same effect as the traditional AGC participation factor approach. The participation factors are inversely proportional to the quadratic cost coefficients.

Method of Multipliers Based Iterative Economic Dispatch

In method of multipliers, an additional term related to an equality constraint is added to the objective function. The advantage of method of multipliers is to achieve faster convergence compared to dual accent method. The economic dispatch problem now becomes:

$$\min_{P_1, P_2} C_1(P_1) + C_2(P_2) + \frac{\rho}{2}(P_1 + P_2 - D_1 - D_2)^2 \quad (13)$$

subject to : $P_1 + P_2 = D_1 + D_2.$ (14)

where $\rho$ is positive. Again, the power imbalance can be reflected by frequency deviation. The $\lambda$ update procedure now becomes:

$$\lambda^{k+1} = \lambda^k + \rho(D_1 + D_2 - P_1^k - P_2^k) \quad (15)$$
$$= \lambda^k - K\Delta f.$$

For a given $\lambda^k$, the dispatch levels $P_1^k$ and $P_2^k$ should minimize the following objective function:

$L(P_1,P_2)=C_1(P_1)+C_2(P_2)+\rho/2(P_1+P_2-D_1-D_2)^2+\lambda^k(D_1+D_2-P_1-P_2).$ (16)

The arguments that minimize $L(P_1,P_2)$ can be found by setting the gradients related to $P_1$ and $P_2$ to zero:

$$\frac{\partial L}{\partial P_1} = 0, \quad (17)$$
$$\frac{\partial L}{\partial P_2} = 0,$$

and then:

$$\Rightarrow \lambda^k = 2a_1 P_1^k + b_1 - \rho(D_1 + D_2 - P_1^k - P_2^k) \quad (18)$$
$$= 2a_2 P_2^k + b_2 - \rho(D_1 + D_2 - P_1^k - P_2^k) \quad (19)$$
$$\Rightarrow \lambda^k = 2a_1 P_1^k + b_1 + K\Delta f_1^k \quad (20)$$
$$= 2a_2 P_2^k + b_2 + K\Delta f_2^k. \quad (21)$$

The iteration for the power commands can be found by replacing the $\lambda$ in equation (12) by the expressions of equations (17) and (18), as given by:

$2a_1(P_1^{k+1}-P_1^k)+K(\Delta f_1^{k+1}-\Delta f_1^k)=-K\Delta f_1^k,$ $2a_2(P_2^{k+1}+P_2^k)+K(\Delta f_2^{k+1}-\Delta f_2^k)=-K\Delta f_2^k.$ (22)

Using the Forward Euler approximation for derivatives, the continuous dynamic model can be found to be:

$2a_1\tau\dot{P}_1+K\tau\Delta\dot{f}_1=-K\Delta f_1,$ $2a_2\tau\dot{P}_2+K\tau\Delta\dot{f}_2=-K\Delta f_2.$ (23)

The transfer functions for the above model are as follows:

$$\frac{\Delta P_1}{\Delta f_1} = -\frac{K}{2a_1}\Big(1 + \frac{1}{\tau s}\Big), \quad (24)$$

$$\frac{\Delta P_2}{\Delta f_2} = -\frac{K}{2a_2}\Big(1 + \frac{1}{\tau s}\Big). \quad (25)$$

The continuous dynamic model not only indicates that method of multipliers based economic dispatch is equivalent to a proportional integral (PI) controller in secondary frequency control, but also indicates that when the gains of the PI controllers for generators are chosen based on generators' cost functions, the local feedback control can realize economic dispatch and frequency regulation simultaneously.

The two dynamic models also indicate that method of multipliers based iteration can achieve faster convergence than the dual decomposition based iteration. The dual decomposition approach can be viewed as a PI control while the method of multipliers approach can be viewed as an integral controller. The PI controller should lead to faster response than the integral controller.

Test System and Simulation Results

Figure 3:
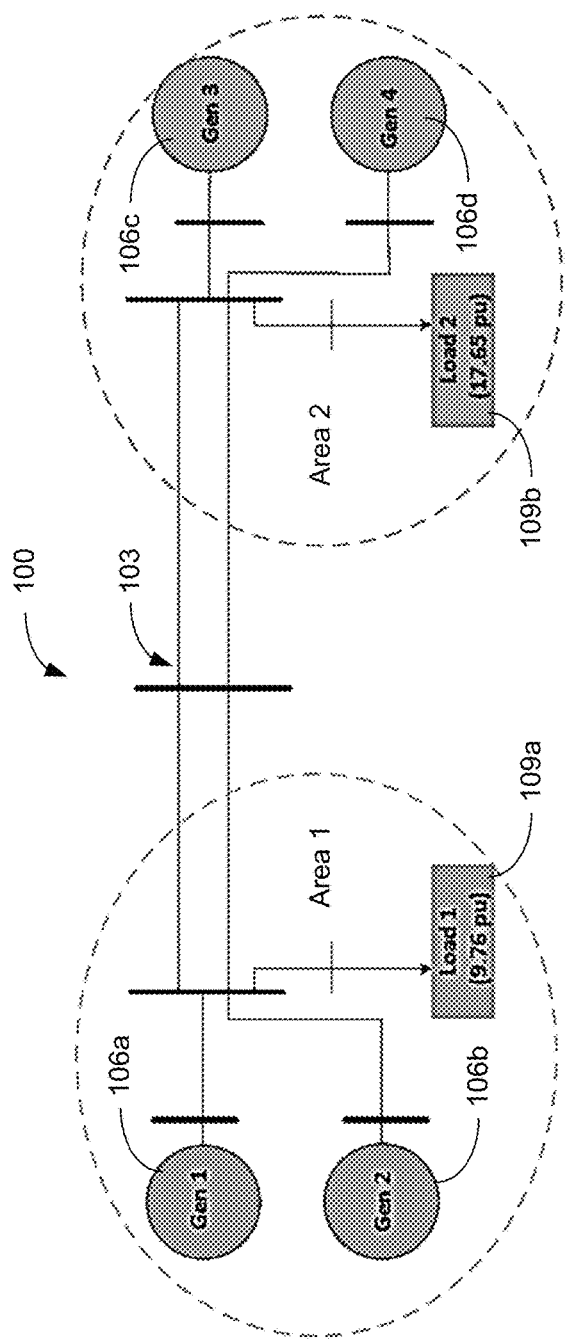
FIG. 3 is a schematic diagram illustrating an example of a power system in accordance with various embodiments of the present disclosure.

Referring to FIG. 3, shown is an example of a test power system 100 based upon a classical two-area four-machine power system with the following modifications: the tie-lines 103 have been shortened; the inertia constants of the machines 106 are reduced to 2.5 pu (per unit) to have faster electromechanical dynamics; the damping coefficients are set to be 1 pu. The generators are modeled as classical generators with a turbine-governor controller. Primary frequency droops with a regulation constant at 4% are all included. Power System Toolbox was selected as the dynamic simulation platform for the evaluation.

Area 1 comprises Gen 1 (106a) and Gen 2 (106b) and Load 1 (109a) and Area 2 comprises Gen 3 (106c), Gen 4

(106d) and Load 2 (109b). The two areas are connected through tie-lines 103. Initially, the four generators 106a-106d are loaded at 687.76 MW, 700 MW, 716 MW, and 700 MW respectively. Assume that in Area 1 the two generators 106a and 106b have the same quadratic cost functions: $1.5P_1^2$ and $1.5P_2^2$ and in Area 2 the two generators 106c and 106d also have the same quadratic cost functions: $P_3^2$ and $P_4^2$. The total load $(D_1+D_2)$ 109 is 27.41 pu with a system power base of 100 MW.

Figure 4:
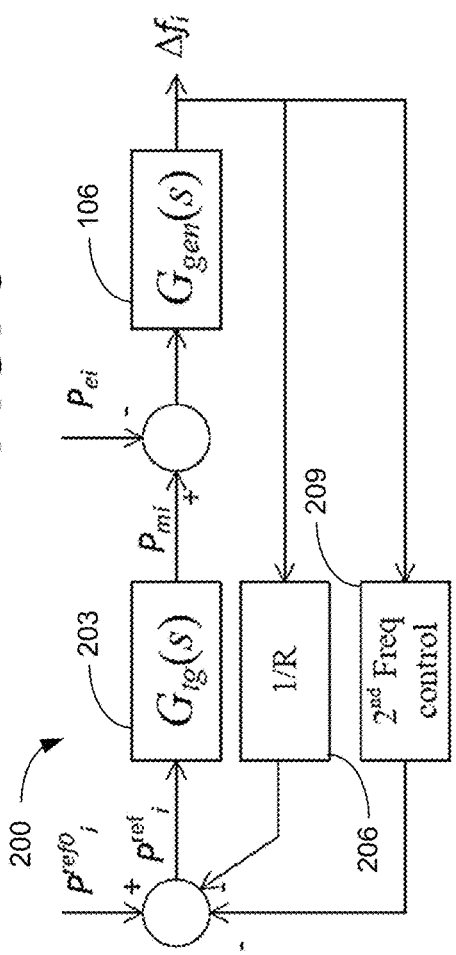
FIG. 4 is a schematic diagram illustrating an example of a generator controller including a primary droop control and a secondary frequency control in accordance with various embodiments of the present disclosure.

Each generator 106 of FIG. 3 is equipped with a generator controller 200 including a turbine-governor control 203 and a primary droop control 206, as shown in the example of FIG. 4. The controller 200 can include controls for the turbine-governor 203, primary droop control 206 and secondary frequency control 209. The transfer function for the turbine governor control 203 can be expressed as follows:

$$G_{tg}(s) = \frac{1}{1+sT_s}\frac{1+sT_3}{1+sT_c}\frac{1+sT_4}{1+sT_5}, \quad (26)$$

where:

| | | |
|---|---|---|
| $T_s$: | servo time constant | 0.1 seconds |
| $T_c$: | HP turbine time constant | 0.5 seconds |
| $T_3$: | transient gain time constant | 0 seconds |
| $T_4$: | time constant to set HP ratio | 1.25 seconds |
| $T_5$: | reheater time constant | 5 seconds |

The secondary frequency control 209 receives a speed or frequency deviation $(\Delta f_i)$ in per unit (pu) from each generator 106 as the input. Output of the secondary frequency control 209 modulates the turbine governor's reference power signal $(P_i^{ref})$ in per unit with a generator power base of 900 MW. Let $\tau=5$ seconds and K=50.

For continuous integral secondary frequency control, the gains of the integral control are: $\frac{K/\tau}{2\times 1.5} = 3.33, \frac{K/\tau}{2\times 1.5} = 3.33, \frac{K/\tau}{2\times 1} = 5, \text{and } \frac{K/\tau}{2\times 1} = 5.$ For discrete control (e.g., every 5 seconds), the power reference signal can be updated based on its previous value and the frequency of $$P_i^{ref}(k+1) = P_i^{ref}(k) - \frac{K}{2a_i}\Delta f_i(k).$$

At t=10 seconds, a total load increase of 80 MW was initiated at the two loads, each increasing 40 MW. Three scenarios were compared to demonstrate the effectiveness of the economic dispatch with feedback control.

Case 0: The four generators 106 have no secondary frequency control 209.
Case 1: The four generators 106 are equipped with continuous integral control as secondary frequency control 209 with $\tau=5$ seconds and K=50.
Case 2: The four generators 106 are equipped with discrete dual decomposition based control as secondary frequency control 209 with $\tau=5$ seconds and K=50.

Referring to FIGS. 5A through 5D, shown are plots illustrating the dynamics of the test power system 100 for case 0, when no secondary frequency control 209 is applied.

Figure 5B:
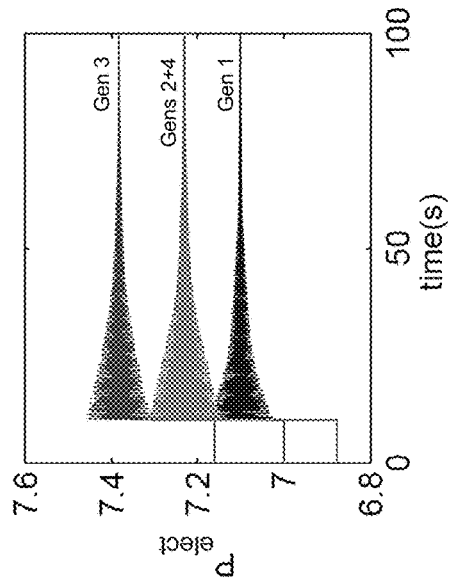
FIGS. 5A through 5D are plots illustrating the dynamics of the power system of FIG. 3 without the secondary frequency control of FIG. 4 in accordance with various embodiments of the present disclosure.
Figure 5D:
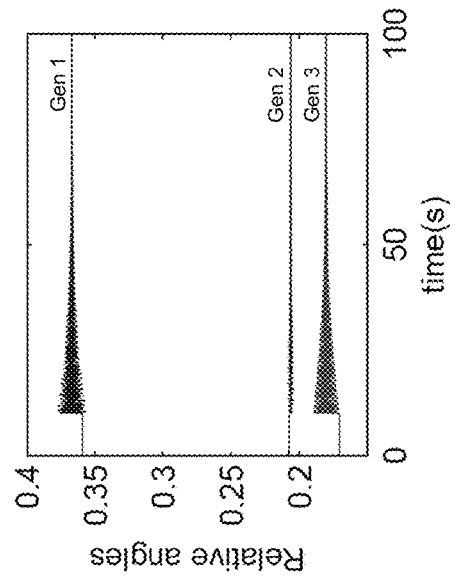
Figure 5A:
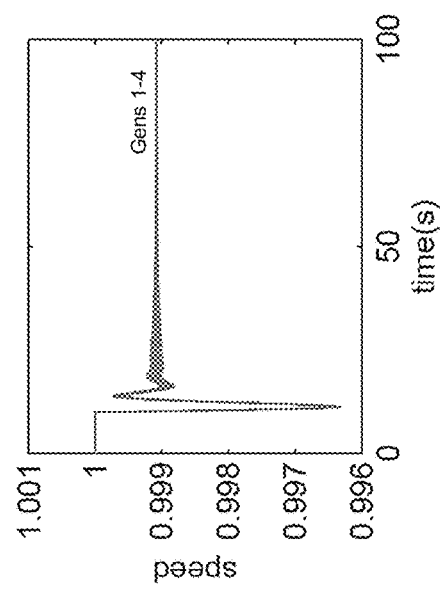
Figure 5C:
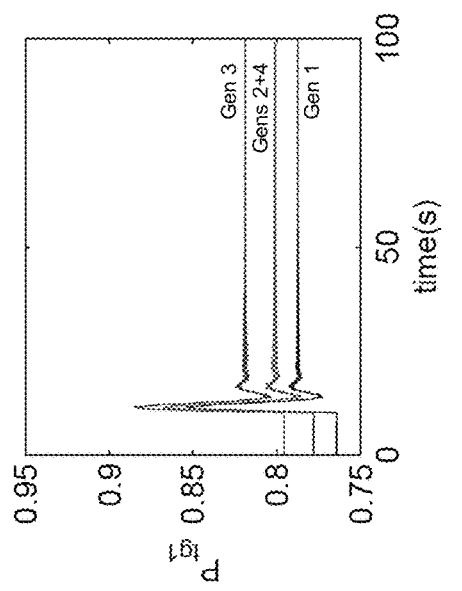

FIG. 5A shows the per unit (pu) speed of the generators 106. FIG. 5B shows the (pu) power of the generators 106 based upon the system power base of 100 MW. Note that generators 106b and 106d supply the same power to the loads. FIG. 5C shows the turbine governor unit power of the generators 106 based upon the generator power base of 900 MW. FIG. 5D shows the angle of Gen 1 (106a), Gen 2 (106b) and Gen 3 (106c) relative to Gen 4 (106d) in radians. The parameters are plotted over a period of 100 seconds.

As can be seen in FIG. 5B, the four generators 106 evenly share the load increase. This is because the same droop regulation constants were used for the four generators 106. Without secondary frequency control 209, the system's frequency of the power system 100 will be lower than the nominal when there is a load increase.

Figure 6:
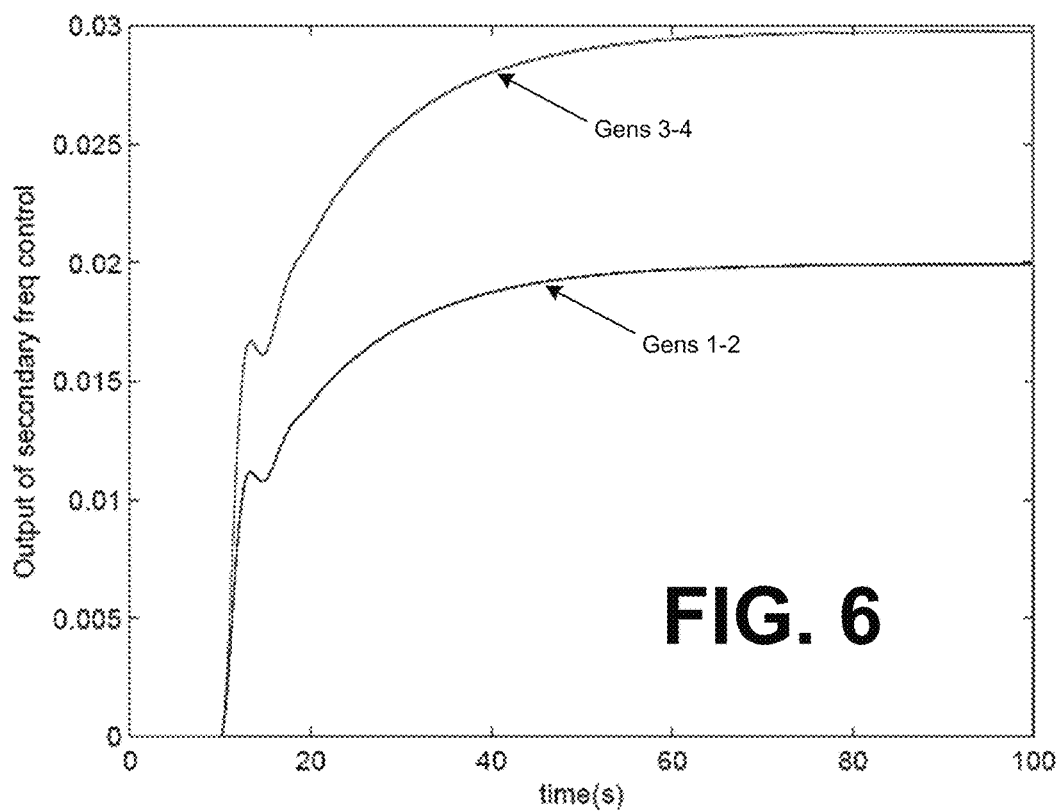
FIG. 6 is a plot of an output of a continuous secondary frequency control of FIG. 4 in accordance with various embodiments of the present disclosure.

Referring next to FIG. 6, shown is an example of the secondary frequency control outputs for the four generators 106 of FIG. 3 when continuous secondary frequency control 209 (FIG. 4) is applied, with a generator power base of 900 MW. It can be seen that Gen 3 (106c) and Gen 4 (106d) now share more power than Gen 1 (106a) and Gen 2 (106b). The ratio of power sharing (1:1:1.5:1.5) is inversely proportional to the cost function's quadratic coefficients (1.5:1.5:1:1).

Figure 7A:
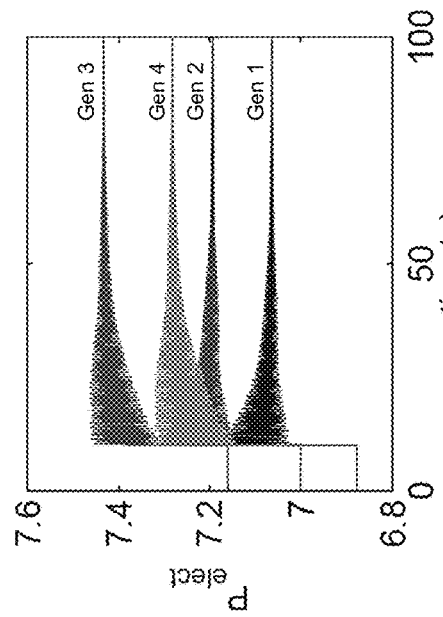
FIGS. 7A through 7D are plots illustrating the dynamics of the power system of FIG. 3 with the continuous secondary frequency control of FIG. 6 in accordance with various embodiments of the present disclosure.
Figure 7B:
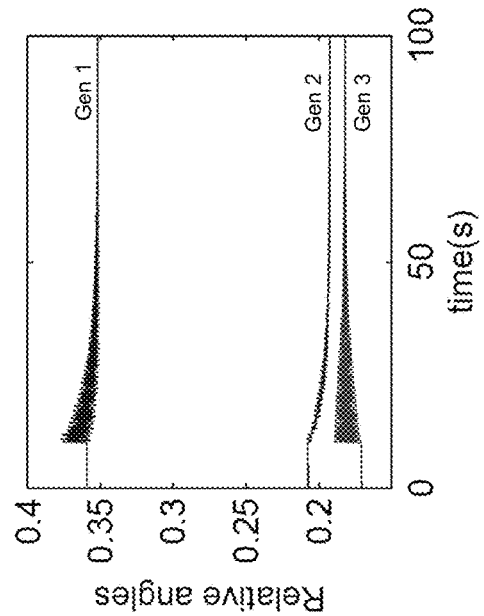
Figure 7C:
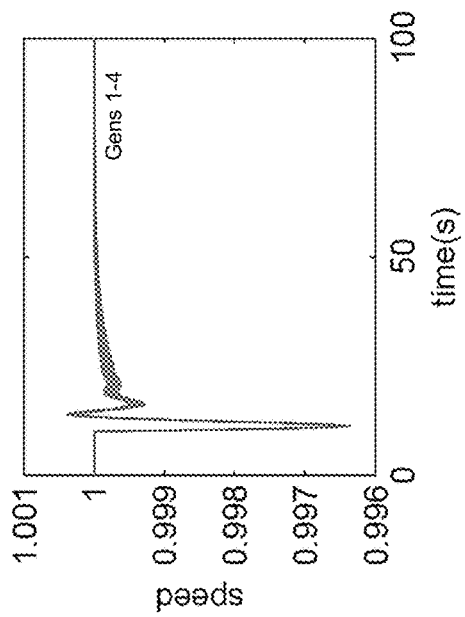
Figure 7D:
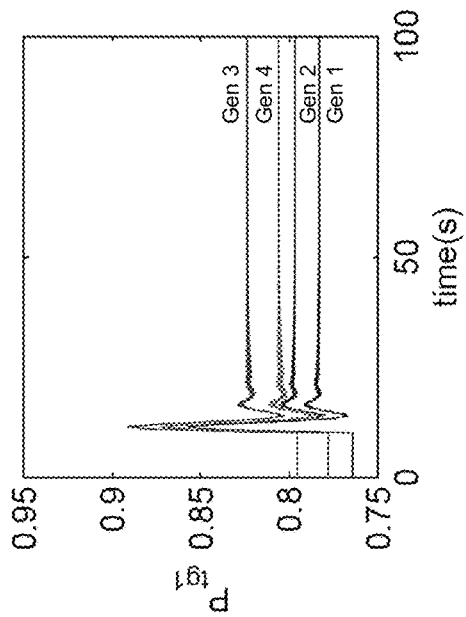

FIGS. 7A through 7D show plots illustrating the dynamics of the test power system 100 (FIG. 3) for case 1, with continuous secondary frequency control 209 applied. FIG. 7A shows the pu speed of the generators 106. FIG. 7B shows the (pu) power of the generators 106 based upon the system power base of 100 MW. FIG. 7C shows the turbine governor unit power of the generators 106 based upon the generator power base of 900 MW. FIG. 7D shows the angle of Gen 1 (106a), Gen 2 (106b) and Gen 3 (106c) relative to Gen 4 (106d) in radians. The parameters are plotted over a period of 100 seconds. As seen in FIG. 7A, with continuous secondary frequency control 209, the system frequency will be brought back to nominal with a load increase.

Figure 8:
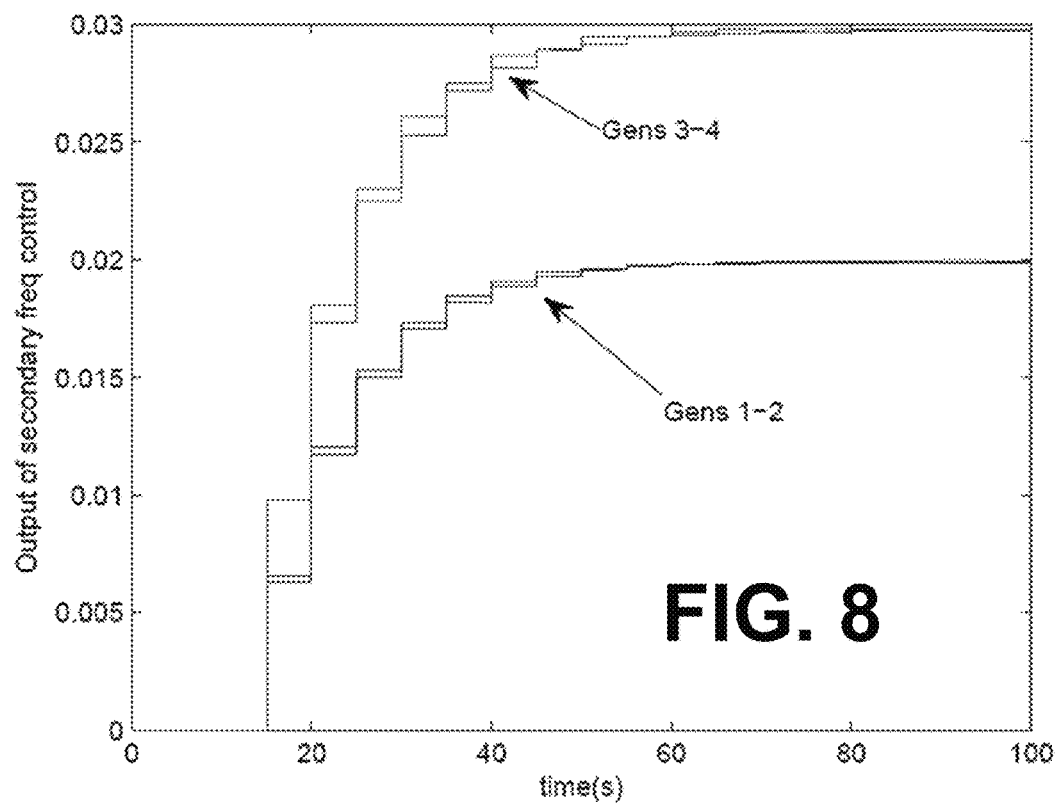
FIG. 8 is a plot of an output of a discrete secondary frequency control of FIG. 4 in accordance with various embodiments of the present disclosure.

Referring now to FIG. 8, shown is an example of the secondary frequency control outputs for the four generators 106 of FIG. 3 when discrete secondary frequency control is applied. It can be seen that Gen 3 (106c) and Gen 4 (106d) now share more power than Gen 1 (106a) and Gen 2 (106b). The ratio of power sharing (1:1:1.5:1.5) is again inversely proportional to the cost function's quadratic coefficients (1.5:1.5:1:1).

FIGS. 9A through 9D show plots illustrating the dynamics of the test power system 100 (FIG. 3) for case 2, with discrete secondary frequency control 209 applied. FIG. 9A shows the pu speed of the generators 106. FIG. 9B shows the (pu) power of the generators 106 based upon the system power base of 100 MW. FIG. 9C shows the turbine governor unit power of the generators 106 based upon the generator power base of 900 MW. FIG. 9D shows the angle of Gen 1 (106a), Gen 2 (106b) and Gen 3 (106c) relative to Gen 4 (106d) in radians. The parameters are plotted over a period of 100 seconds. As seen in FIG. 9A, with discrete secondary frequency control 209, the system frequency will be brought back to nominal with a load increase.

The table in FIG. 10A presents a comparison of the three cases (Case 0, Case 1 and Case 2) in terms of electric power $P_e$ output from each generator 106 of FIG. 3. The numerical results indicate that with droop control 206 only, all four generators 106 equally share the load increase. However, with continuous or discrete secondary frequency control 209, the power sharing among the four generators 102 is approximately in the ratio 1:1:1.5:1.5. Additionally, the table in FIG. 10B presents a comparison of the three cases (Case 0, Case 1 and Case 2) in terms of mechanical power $P_m$ output from each generator 106 of FIG. 3. The numerical results indicate that with droop control 206 only, all four generators 106 equally share the load increase. Again, with continuous or discrete secondary frequency control 209, the power sharing among the four generators 102 is approximately in the ratio 1:1:1.5:1.5.

Figure 11A:
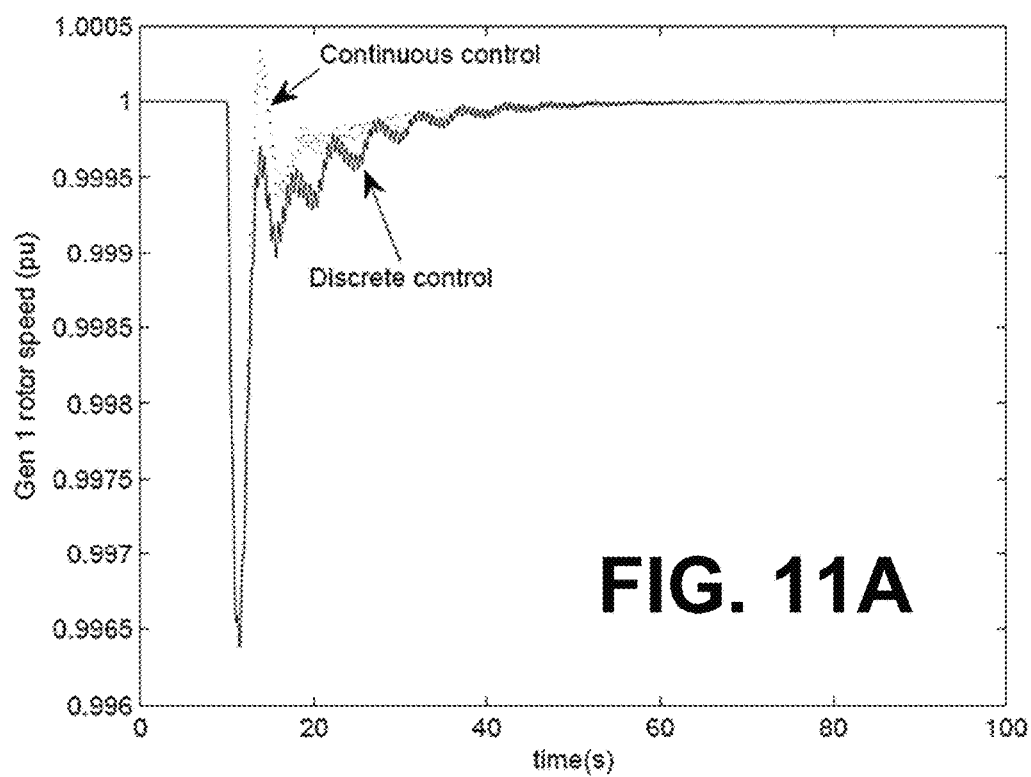
FIGS. 11A and 11B are plots comparing generator speed and control output for the continuous secondary frequency control of FIG. 6 and the discrete secondary frequency control of FIG. 8 in accordance with various embodiments of the present disclosure.
Figure 11B:
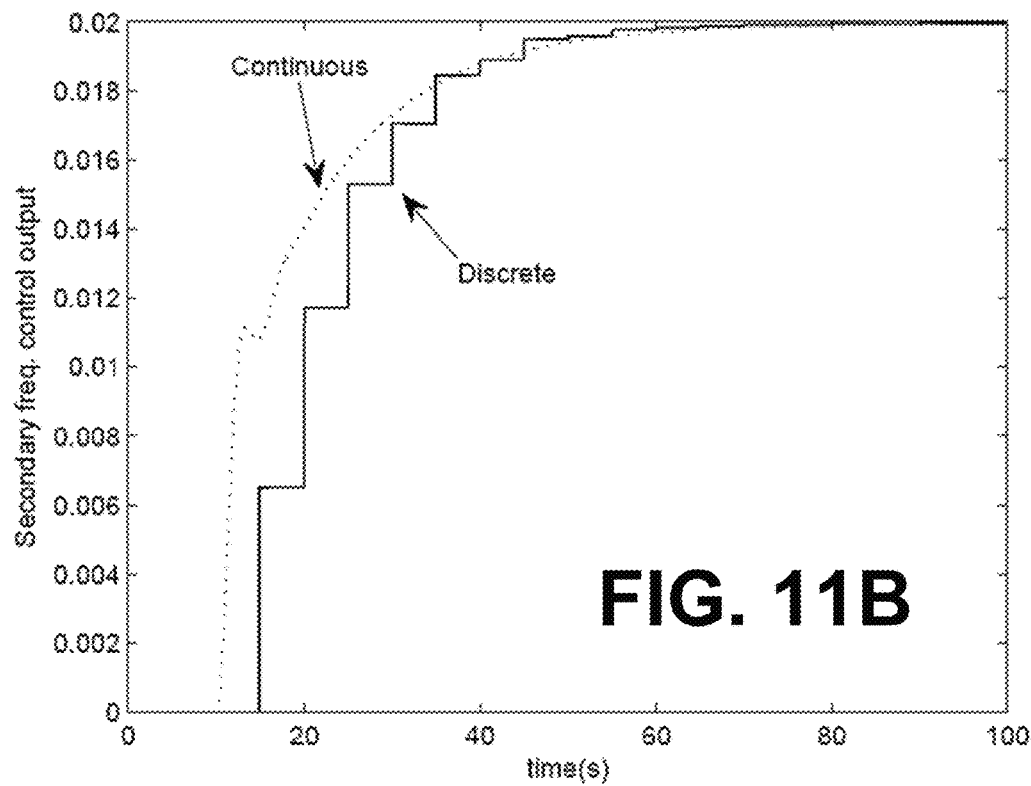

The continuous and discrete secondary frequency control cases are compared in FIGS. 11A and 11B. In FIG. 11A, the speed of Gen 1 (106*a*) of FIG. 3 is plotted for the continuous and discrete control cases over the 100 second time period. In FIG. 11B, the output of the secondary frequency control 209 of FIG. 4 is plotted for the continuous and discrete control cases over the same time period. Both the continuous and discrete feedback controls can simultaneously realize economic operation and secondary frequency regulation.

Both continuous and discrete feedback control can realize economic operation and secondary frequency regulation simultaneously. The case study system was assumed to be operated by one utility. Therefore, the local frequency was used as a signal for the secondary frequency control instead of an area control error (ACE) signal. The frequency measurement can be replaced by an ACE input signal for the disclosed control method in achieving simultaneous economic operation and frequency/tie-line power flow regulation.

As in the traditional AGC implementation, implementation of the disclosed secondary frequency control considers many other factors such as, e.g., generator capacity limits, ramp speed limits, noises in the ACE signal, etc. Methods adopted in traditional AGC such as filtering of the ACE, unit control logic to allow the secondary frequency control to take care of generator capacity limits and ramp speed can also be adopted for the disclosed controllers.

In this disclosure, two iterative approaches to solve an economic operation problem were examined: dual accent (or decomposition) and the method of multipliers approaches. If the system has primary frequency control in place, then the power imbalance can be represented by frequency deviation and an iteration procedure can be equivalent to an integral or PI control. The parameters of the secondary frequency controllers for generators can be set based on cost functions of the generators. This way, frequency regulation and economic operation can be realized simultaneously.

Figure 12:
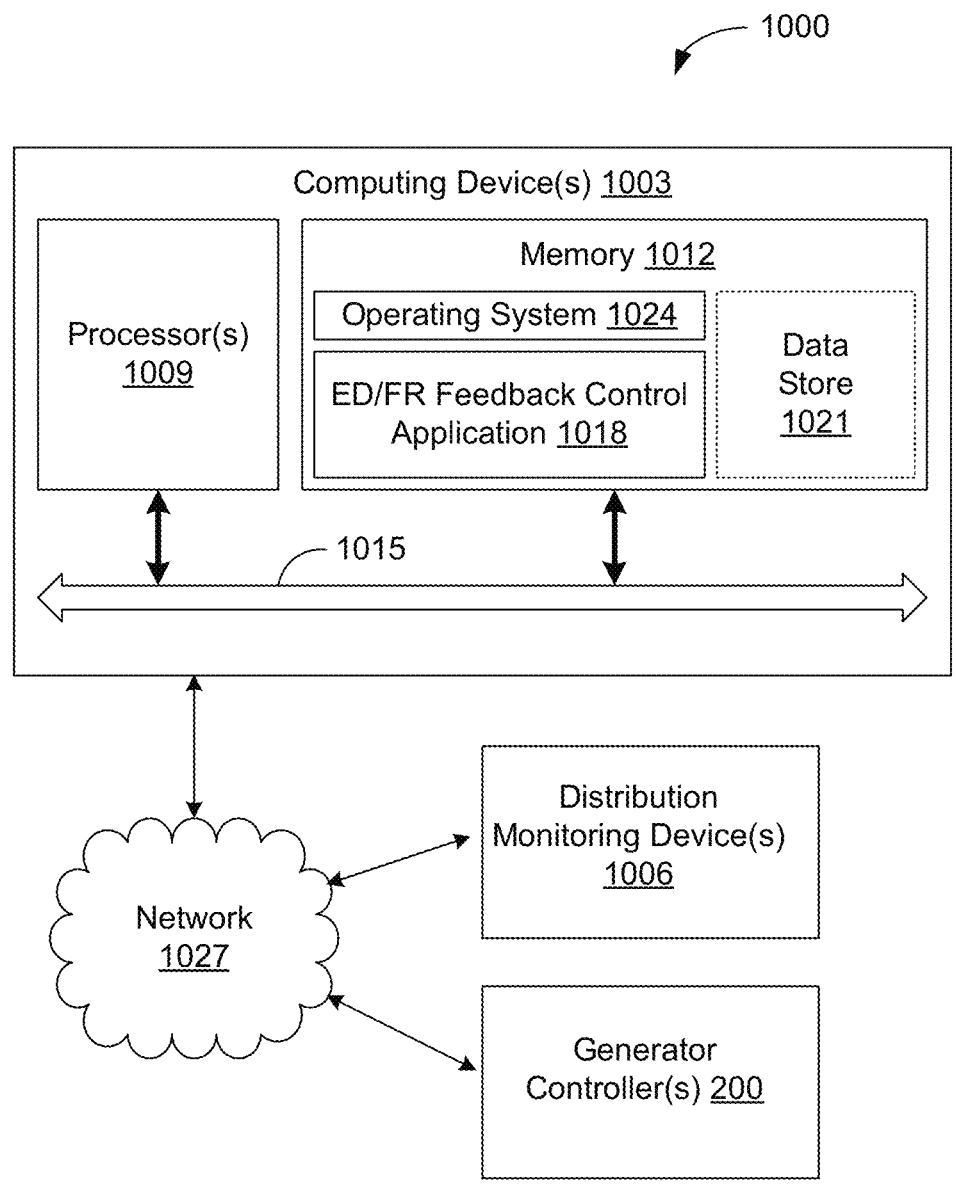
FIG. 12 is an example of a system that may be utilized in power distribution analysis and control according to various embodiments of the present disclosure.

Referring now to FIG. 12, shown is an example of a system 1000 that may be utilized in the monitoring and control of power systems. The system 1000 includes one or more computing device(s) 1003, one or more distribution monitoring device(s) 1006 that can be distributed about a power distribution network to provide indications of operational conditions in the power distribution network, and one or more generator controller(s) 200 such as the example in FIG. 4. For example, the distribution monitoring device(s) 1006 can monitor electrical power distribution by monitoring conditions of components of the distribution network such as generators and/or distribution buses. Monitored conditions can include voltage levels, current flows, frequencies, operating speeds, and/or other conditions of the various system components. The generator controller(s) 200 can control the operation of the corresponding generator(s) 106 (FIG. 3) based upon signals received from the computing device 1003.

The computing device 1003 includes at least one processor circuit, for example, having a processor 1009 and a memory 1012, both of which are coupled to a local interface 1015. To this end, the computing device(s) 1003 may comprise, for example, a server computer or any other system providing computing capability. The computing device(s) 1003 may include, for example, one or more display devices such as cathode ray tubes (CRTs), liquid crystal display (LCD) screens, gas plasma-based flat panel displays, LCD projectors, or other types of display devices, etc. The computing device(s) 1003 may also include, for example various peripheral devices. In particular, the peripheral devices may include input devices such as, for example, a keyboard, keypad, touch pad, touch screen, microphone, scanner, mouse, joystick, or one or more push buttons, etc. Even though the computing device 1003 is referred to in the singular, it is understood that a plurality of computing devices 1003 may be employed in the various arrangements as described above. The local interface 1015 may comprise, for example, a data bus with an accompanying address/control bus or other bus structure as can be appreciated.

Stored in the memory 1012 are both data and several components that are executable by the processor 1009. In particular, stored in the memory 1012 and executable by the processor 1009 include an economic dispatch and frequency regulation (ED/FR) feedback control application 1018 and potentially other applications. Also stored in the memory 1012 may be a data store 1021 and other data. The data stored in the data store 1021, for example, is associated with the operation of the various applications and/or functional entities described below. For example, the data store may include sample analysis results, corrective measures, and other data or information as can be understood. In addition, an operating system 1024 may be stored in the memory 1012 and executable by the processor 1009. The data store 1021 may be may be located in a single computing device or may be dispersed among many different devices.

The distribution monitoring device 1006 is representative of a plurality of devices that may be communicatively coupled to the computing device 1003 through a network 1027 such as, e.g., the Internet, intranets, extranets, wide area networks (WANs), local area networks (LANs), wired networks, wireless networks, networks configured for communication over a power grid, or other suitable networks, etc., or any combination of two or more such networks. The distribution monitoring device 1006 may comprise, for example, a processor-based system such as a computer system or other application specific monitoring system with communication capabilities. In some embodiments, a distribution monitoring device 1006 may be directly connected to the computing device 1003.

The components executed on the computing device 1003 include, for example, the ED/FR feedback control application 1018 and other systems, applications, services, processes, engines, or functionality not discussed in detail herein. The computing device 1003 can receive information regarding the monitored component from a distribution monitoring device 1006, which can then be evaluated by the ED/FR feedback control application 1018. The computing device 1003 may also receive stored information regarding a power distribution network for modeling and evaluation of the network.

It is understood that there may be other applications that are stored in the memory 1012 and are executable by the processor 1009 as can be appreciated. Where any component discussed herein is implemented in the form of software, any one of a number of programming languages may be employed such as, for example, C, C++, C#, Objective C, Java, Java Script, Perl, PHP, Visual Basic, Python, Ruby, Delphi, Flash, or other programming languages.

A number of software components are stored in the memory 1012 and are executable by the processor 1009. In this respect, the term "executable" means a program file that is in a form that can ultimately be run by the processor 1009. Examples of executable programs may be, for example, a compiled program that can be translated into machine instructions in a format that can be loaded into a random access portion of the memory 1012 and run by the processor 1009, source code that may be expressed in proper format such as object code that is capable of being loaded into a random access portion of the memory 1012 and executed by the processor 1009, or source code that may be interpreted by another executable program to generate instructions in a random access portion of the memory 1012 to be executed by the processor 1009, etc. An executable program may be stored in any portion or component of the memory 1012 including, for example, random access memory (RAM), read-only memory (ROM), hard drive, solid-state drive, USB flash drive, memory card, optical disc such as compact disc (CD) or digital versatile disc (DVD), floppy disk, magnetic tape, or other memory components.

Also, the processor 1009 may represent multiple processors 1009 and the memory 1012 may represent multiple memories 1012 that operate in parallel processing circuits, respectively. In such a case, the local interface 1015 may be an appropriate network that facilitates communication between any two of the multiple processors 1009, between any processor 1009 and any of the memories 1012, or between any two of the memories 1012, etc. The local interface 1015 may comprise additional systems designed to coordinate this communication, including, for example, performing load balancing. The processor 1009 may be of electrical or of some other available construction.

Although the ED/FR feedback control application 1018, and other various systems described herein, may be embodied in software or instructions executed by general purpose hardware as discussed above, as an alternative the same may also be embodied in dedicated hardware or a combination of software/general purpose hardware and dedicated hardware. If embodied in dedicated hardware, each can be implemented as a circuit or state machine that employs any one of or a combination of a number of technologies. These technologies may include, but are not limited to, discrete logic circuits having logic gates for implementing various logic functions upon an application of one or more data signals, application specific integrated circuits having appropriate logic gates, or other components, etc. Such technologies are generally well known by those skilled in the art and, consequently, are not described in detail herein.

Any logic or application described herein, including the ED/FR feedback control application 1018, that comprises software or instructions can be embodied in any non-transitory computer-readable medium for use by or in connection with an instruction execution system such as, for example, a processor 1009 in a computer system or other system. In this sense, the logic may comprise, for example, statements including instructions and declarations that can be fetched from the computer-readable medium and executed by the instruction execution system. In the context of the present disclosure, a "computer-readable medium" can be any medium that can contain, store, or maintain the logic or application described herein for use by or in connection with the instruction execution system. The computer-readable medium can comprise any one of many physical media such as, for example, electronic, magnetic, optical, electromagnetic, infrared, or semiconductor media. More specific examples of a suitable computer-readable medium would include, but are not limited to, magnetic tapes, magnetic floppy diskettes, magnetic hard drives, memory cards, solid-state drives, USB flash drives, or optical discs. Also, the computer-readable medium may be a random access memory (RAM) including, for example, static random access memory (SRAM) and dynamic random access memory (DRAM), or magnetic random access memory (MRAM). In addition, the computer-readable medium may be a read-only memory (ROM), a programmable read-only memory (PROM), an erasable programmable read-only memory (EPROM), an electrically erasable programmable read-only memory (EEPROM), or other type of memory device.

It should be emphasized that the above-described embodiments of the present disclosure are merely possible examples of implementations set forth for a clear understanding of the principles of the disclosure. Many variations and modifications may be made to the above-described embodiment(s) without departing substantially from the spirit and principles of the disclosure. All such modifications and variations are intended to be included herein within the scope of this disclosure and protected by the following claims.

It should be noted that ratios, concentrations, amounts, and other numerical data may be expressed herein in a range format. It is to be understood that such a range format is used for convenience and brevity, and thus, should be interpreted in a flexible manner to include not only the numerical values explicitly recited as the limits of the range, but also to include all the individual numerical values or sub-ranges encompassed within that range as if each numerical value and sub-range is explicitly recited. To illustrate, a concentration range of "about 0.1% to about 5%" should be interpreted to include not only the explicitly recited concentration of about 0.1 wt % to about 5 wt %, but also include individual concentrations (e.g., 1%, 2%, 3%, and 4%) and the sub-ranges (e.g., 0.5%, 1.1%, 2.2%, 3.3%, and 4.4%) within the indicated range. The term "about" can include traditional rounding according to significant figures of numerical values. In addition, the phrase "about 'x' to 'y'" includes "about 'x' to about 'y'".

Therefore, at least the following is claimed:

1. A method, comprising:
    obtaining, by a computing device, a frequency difference associated with a generator of a power system, where the frequency difference is based upon a current operational value of the generator and a reference value;
    determining, by the computing device, an output power adjustment based at least in part upon the frequency difference and a cost function ($C_i$) associated with the generator, where the cost function is based upon a power dispatch level ($P_i$) of the generator and the output power adjustment is determined using dual decomposition based at least in part upon the cost function associated with the generator, where a dual decomposition problem for a two-area system is given by:

$$\max_{\lambda} \quad \min_{P_1} \; C_1(P_1) + \lambda(D_1 - P_1)$$
$$+ \min_{P_2} \; C_2(P_2) + \lambda(D_2 - P_2)$$

where $D_i$ is a load for area i and $\lambda$ is a price; and
    providing, by the computing device, a power command to a secondary frequency control of the generator, the power command based upon the output power adjustment.

2. The method of claim 1, wherein obtaining the frequency difference comprises receiving a current output frequency of the generator from a distribution monitoring device and determining the frequency difference based upon the current output frequency and a reference frequency.

3. The method of claim 1, wherein obtaining the frequency difference comprises receiving a current speed of the generator and determining the frequency difference based upon the current speed and a reference speed.

4. The method of claim 1, wherein the power command is a continuous control output.

5. The method of claim 1, wherein the power command is a discrete control output.

6. The method of claim 1, comprising:
determining a second output power adjustment for a second generator based at least in part upon a frequency difference associated with the second generator and a cost function associated with the second generator, where the frequency difference associated with the second generator is based upon a current operational value of the second generator and the cost function associated with the second generator is based upon a power dispatch level of the second generator; and
providing a second power command to a secondary frequency control of the second generator, the power command based upon the second output power adjustment.

7. A generator control system, comprising:
a primary frequency controller configured to control frequency drop of a generator of a power system; and
a secondary frequency controller configured to adjust output power of the generator based at least in part upon a frequency difference associated with the generator and a cost function ($C_i$) associated with the generator, where the frequency difference is based upon a monitored operational value of the generator and a reference value and the cost function is based upon a power dispatch level ($P_i$) of the generator, and where the adjustment of the output power of the generator is determined based at least in part upon the cost function associated with the generator using dual decomposition, where a dual decomposition problem for a two-area system is given by:

$$\max_{\lambda} \quad \min_{P_1} \quad C_1(P_1) + \lambda(D_1 - P_1)$$

-continued $$+\min_{P_2} \quad C_2(P_2) + \lambda(D_2 - P_2)$$

where $D_i$ is a load for area i and $\lambda$ is a price.

8. The generator system of claim 7, comprising processing circuitry configured to:
determine an output power adjustment for the adjustment of the output power of the generator; and
provide a power command to adjust operating frequency of the generator, the power command based upon the output power adjustment.

9. The generator system of claim 8, wherein the frequency difference is determined from a current output frequency of the generator and a reference frequency.

10. The generator system of claim 9, wherein the current output frequency of the generator is provided by a distribution monitoring device of the power system.

11. The generator system of claim 8, wherein the frequency difference is determined from a current speed of the generator and a reference speed.

12. The generator system of claim 11, wherein the current speed is provided by a sensor on the generator.

13. The generator system of claim 8, wherein the power command is a continuous control output.

14. The generator system of claim 8, comprising wherein the power command is a discrete control output.

15. The generator system of claim 8, comprising a second secondary frequency controller configured to adjust output power of a second generator, wherein the processing circuitry is configured to:
determine a second output power adjustment for the second generator based at least in part upon a frequency difference associated with the second generator and a cost function associated with the second generator, where the frequency difference associated with the second generator is based upon a current operational value of the second generator and the cost function associated with the second generator is based upon a power dispatch level of the second generator; and
provide a second power command to adjust operating frequency of the second generator, the power command based upon the second output power adjustment.

16. The generator system of claim 8, wherein the secondary frequency controller comprises the processing circuitry.

* * * * *